(12) United States Patent
Wang et al.

(10) Patent No.: US 9,484,244 B2
(45) Date of Patent: *Nov. 1, 2016

(54) STRUCTURES AND METHODS FOR FORMING FIN STRUCTURES

(71) Applicant: Taiwan Semiconductor Manufacturing Company Limited, Hsinchu (TW)

(72) Inventors: Sheng-Chen Wang, Hsinchu (TW); Sai-Hooi Yeong, Hsinchu County (TW); Tsung-Yao Wen, Hsinchu (TW); Yen-Ming Chen, Hsin-Chu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 35 days.

This patent is subject to a terminal disclaimer.

(21) Appl. No.: 14/250,911

(22) Filed: Apr. 11, 2014

(65) Prior Publication Data

US 2015/0294897 A1   Oct. 15, 2015

(51) Int. Cl.
*H01L 21/8242* (2006.01)
*H01L 21/762* (2006.01)
*H01L 29/78* (2006.01)
*H01L 29/66* (2006.01)

(52) U.S. Cl.
CPC ... *H01L 21/76224* (2013.01); *H01L 29/66795* (2013.01); *H01L 29/66818* (2013.01); *H01L 29/785* (2013.01)

(58) Field of Classification Search
CPC ........... H01L 29/66795; H01L 29/785; H01L 29/1054; H01L 29/6656; H01L 29/66818; H01L 29/7834; H01L 29/1037; H01L 29/6681; H01L 29/66545; H01L 21/823431; H01L 21/823821; H01L 21/823412; H01L 21/823828; H01L 21/823864; H01L 21/823807; H01L 21/845; H01L 21/30604; H01L 21/31055; H01L 21/31111; H01L 21/76224; H01L 21/823481; H01L 21/823878; H01L 27/0886; H01L 27/0924; H01L 27/1211; H01L 2029/7858
See application file for complete search history.

(56) References Cited

U.S. PATENT DOCUMENTS

| | | | | |
|---|---|---|---|---|
| 2014/0027860 A1* | 1/2014 | Glass | ............... | H01L 21/823807 257/401 |
| 2014/0377922 A1* | 12/2014 | Fung | ............... | H01L 21/823431 438/283 |
| 2015/0044842 A1* | 2/2015 | Wang | ............... | H01L 29/665 438/296 |
| 2015/0099347 A1* | 4/2015 | Zhang | ............... | H01L 29/66795 438/478 |

* cited by examiner

*Primary Examiner* — Chuong A Luu
*Assistant Examiner* — Cory Eskridge
(74) *Attorney, Agent, or Firm* — Jones Day

(57) ABSTRACT

Structures and methods are provided for forming fin structures. A first fin structure is formed on a substrate. A shallow-trench-isolation structure is formed surrounding the first fin structure. At least part of the first fin structure is removed to form a cavity. A first material is formed on one or more side walls of the cavity. A second material is formed to fill the cavity, the second material being different from the first material. At least part of the STI structure is removed to form a second fin structure including the first material and the second material. At least part of the first material that surrounds the second material is removed to fabricate semiconductor devices.

25 Claims, 6 Drawing Sheets

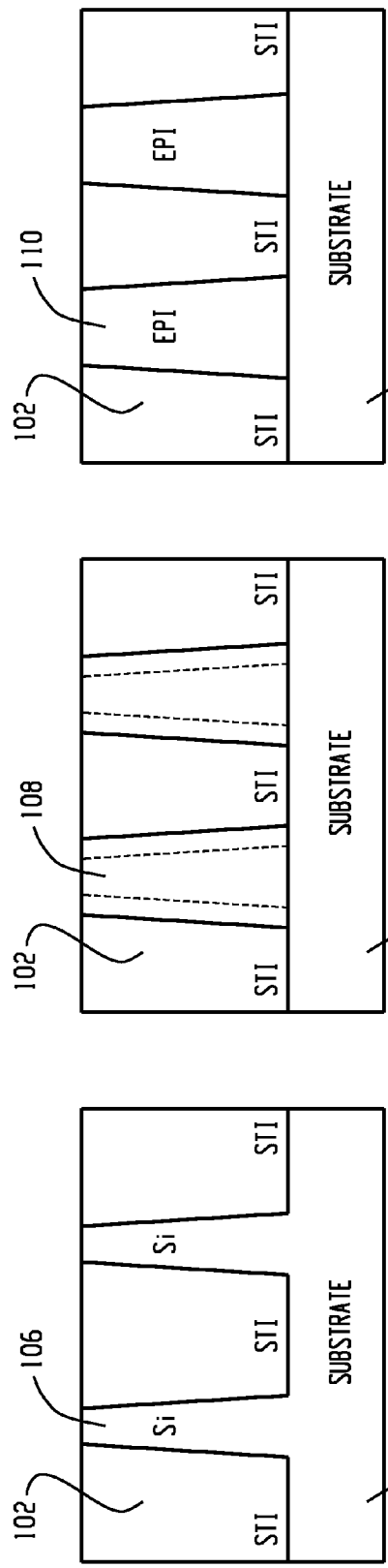
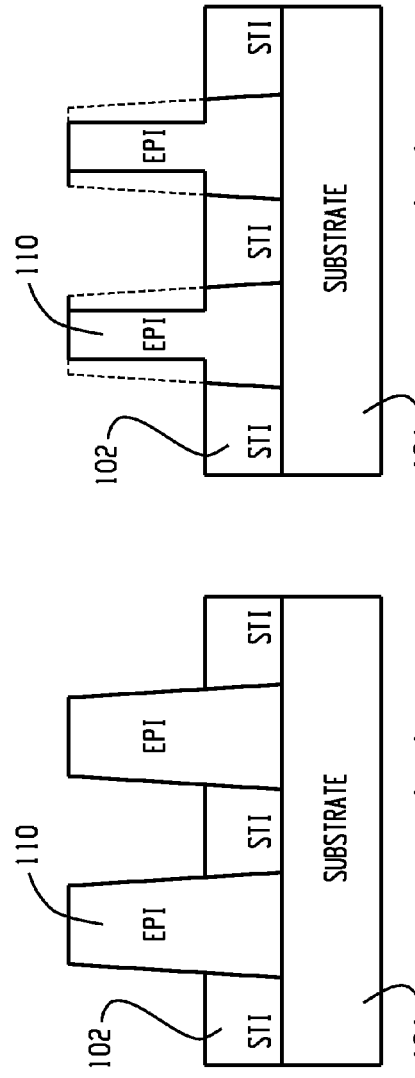
Fig. 1(A)
Fig. 1(B)
Fig. 1(C)
Fig. 1(D)
Fig. 1(E)

STRUCTURES AND METHODS FOR FORMING FIN STRUCTURES

BACKGROUND

The technology described in this disclosure relates generally to semiconductor devices and more particularly to fabrication of semiconductor devices.

Traditional planar devices often encounter various problems, such as short-channel effects and poor sub-threshold characteristics, as feature sizes of the devices continue to shrink. Non-planar devices, such as FinFETs, have become more and more popular to improve device performance and increase packing densities in devices and circuits. A FinFET usually includes semiconductor fin structure formed vertically on a substrate. A gate structure is formed over and along the sides of the fin structure to produce faster, more reliable and better-controlled devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1(A)-FIG. 1(E) depict example diagrams showing a process for forming fin structures, in accordance with some embodiments.

DETAILED DESCRIPTION

Figure 2A:
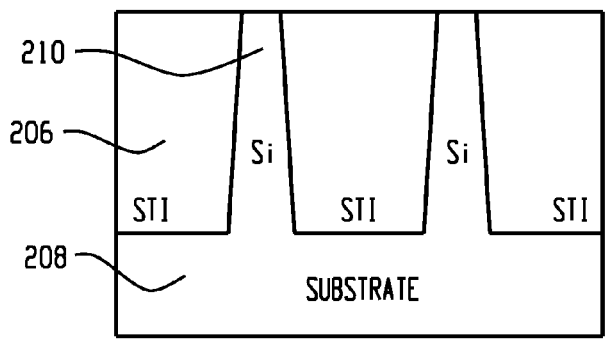
FIG. 2(A)-FIG. 2(G) depict example diagrams showing a process for forming fin structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "above," "on," "top," "bottom," "in" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1(A)-FIG. 1(E) depict example diagrams showing a process for forming fin structures, in accordance with some embodiments. As shown in FIG. 1(A), one or more shallow trench isolation (STI) structures 102 are formed on a substrate 104 and surround one or more fin structures 106. For example, the fin structures 106 are associated with a feature size. An etching process and a cleaning process are performed. The fin structures 106 and part of the STI structures 102 are removed to form one or more cavities 108, as shown in FIG. 1(B), where the dashed lines correspond to the contours of the fin structures 106. As such, the size of the cavities 108 is larger than the feature size of the fin structures 106. A channel material (e.g., silicon, silicon germanium) is formed (e.g., through epitaxial growth) to fill the cavities 108 to form one or more second fin structures 110, as shown in FIG. 1(C). A chemical-mechanical planarization/polishing (CMP) process may be performed to remove part of the channel material that extends above the cavities 108. As shown in FIG. 1(D), an etching process is performed to remove part of the STI structures 102 to expose part of the second fin structures 110. The second fin structures 110 are associated with the size of the cavities 108 which is larger than the desired size (e.g., the feature size of the first fin structures 106). Thus, a channel-reshape process (e.g., an etching process) is performed to thin down the second fin structures 110, as shown in FIG. 1(E). However, the surfaces of the resulting structures are often very rough due to the channel-reshape process, and the device performance is usually negatively affected.

Figure 2B:
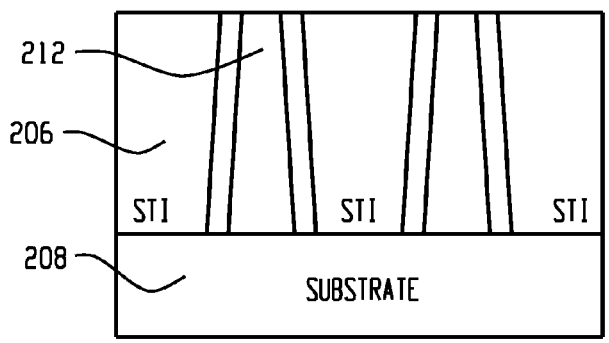

FIG. 2(A)-FIG. 2(G) depict example diagrams showing a process for forming fin structures, in accordance with some embodiments. As shown in FIG. 2(A)-FIG. 2(E), a shell material 202 is deposited to protect fin structures 204 formed through epitaxial growth. Specifically, as shown in FIG. 2(A), one or more shallow trench isolation (STI) structures 206 are formed on a substrate 208 and surround one or more fin structures 210. For example, a patterned photoresist or hardmask is formed on the substrate 208, and the substrate 208 is etched (e.g., through a dry etching process or a wet etching process) to form the fin structures 210 and define one or more STI regions. A dielectric material (e.g., silicon dioxide) is deposited in the STI regions to form the STI structures 206. A CMP process is performed to remove part of the dielectric material to planarize a top surface of the STI structures 206. As an example, the fin structures 210 are associated with a feature size. An etching process (e.g., a dry etching process using plasma, or a wet etching process using a mixture of ammonia and water) and a cleaning process are performed. The fin structures 210 and part of the STI structures 206 are removed to form one or more cavities 212, as shown in FIG. 2(B). The size of the cavities 212 is larger than the feature size of the fin structures 210.

Figure 2C:
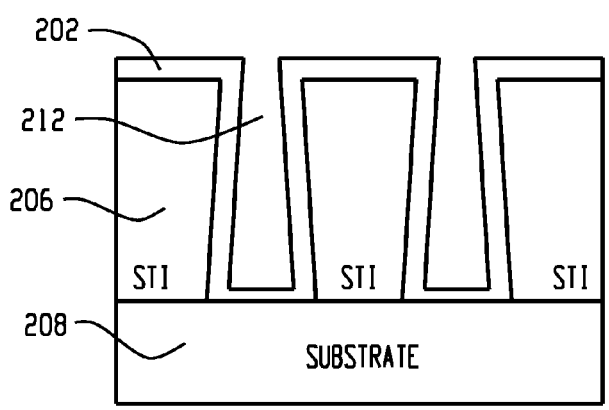

As shown in FIG. 2(C), the shell material 202 is formed on one or more side walls and a bottom surface of the cavities 212 to fill part of the cavities 212. For example, the shell material 202 includes silicon carbon nitride (SiCN), silicon oxygen nitride (SiON), or other suitable materials. The deposition of the shell material 202 is performed through plasma-enhanced atomic layer deposition (PEALD) with an operation pressure under $10^{-1}$ torr at a temperature in a range of about 450° C. to about 550° C. The plasma power for the deposition of the shell material 202 is in a range of about 20 W to about 500 W, and a general operation power is about 100 W. One or more precursors, such as diselenocarbamates (DSC) and ammonia ($NH_3$), are introduced for the deposition of the shell material 202 with a flow rate in a range of about 1 standard-litter-per-minute (SLM) to about 2 SLM.

Figure 2D:
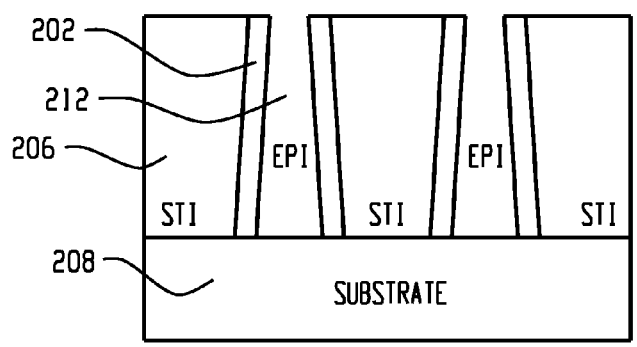
Figure 2E:
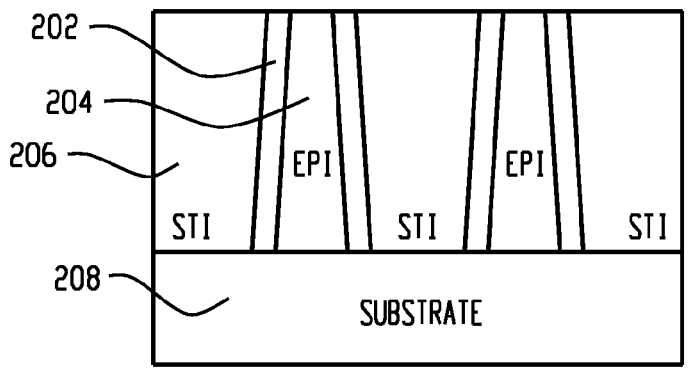
Figure 2F:
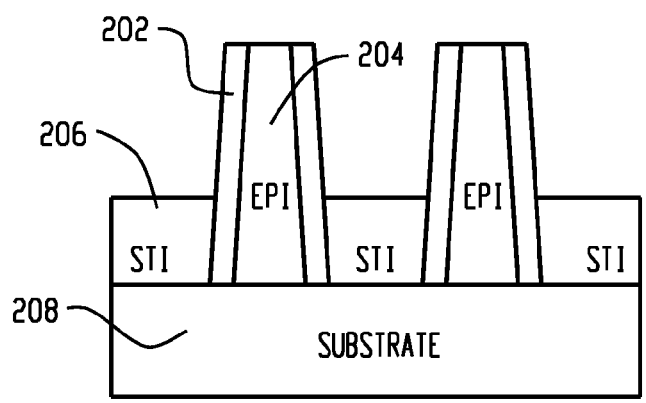
Figure 2G:
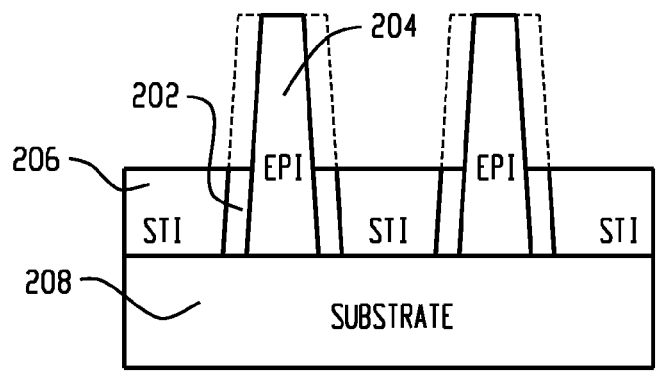

Another etching process (e.g., a dry etching process) is performed to remove part of the shell material 202 on the bottom surface of the cavities 212, as shown in FIG. 2(D). In some embodiments, the cavities 212 are associated with a reduced size because of the deposition of the shell material 202, and the reduced size is comparable to the feature size of the fin structures 210. A cleaning process may be performed thereafter. A channel material (e.g., silicon, silicon germanium) is formed (e.g., through epitaxial growth) to fill the cavities 212 to form one or more second fin structures 204, as shown in FIG. 2(E). A chemical-mechanical planarization/polishing (CMP) process may be performed to remove part of the channel material that extends above the cavities 212. As shown in FIG. 2(F), a recess process (e.g., through an etching process) is performed to remove part of the STI structures 206 to expose part of the shell material 202 that surrounds the fin structures 204. Part of the shell material 202 is removed to expose part of the fin structures 204, as shown in FIG. 2(G). For example, the shell material 202 is removed through a wet etching process in which a solution including phosphoric acid is used at a temperature less than about 500° C. for more than 1000 seconds. The second fin structures 204 are associated with a size comparable to the desired size (e.g., the feature size of the first fin structures 210).

In some embodiments, one or more additional processes may be performed to fabricate a device. For example, a gate structure is formed over a channel region of the fin structures 204. Source/drain features are formed in one or more source/drain regions. The gate structure may be formed using a gate-first process or a gate-last process. As an example, in a gate-first process, a dielectric layer is deposited over the fin structures 204, and then the gate structure (e.g., gate electrodes) is formed on the dielectric layer. Gate spacers may be formed on the walls of the gate structure and adjacent to the source/drain regions of the device. Then, a source/drain feature may be formed in a source/drain region through removing semiconductor materials in the source/drain region and depositing doped materials in the source/drain region.

In certain embodiments, the substrate 208 includes silicon, germanium, silicon germanium, silicon carbide, gallium arsenide, gallium phosphide, indium phosphide, indium arsenide, indium antimonide, or other suitable materials. For example, the substrate 208 includes a silicon-on-insulator (SOI) substrate. The substrate 208 may include various doped regions and/or other suitable features.

Figure 3A:
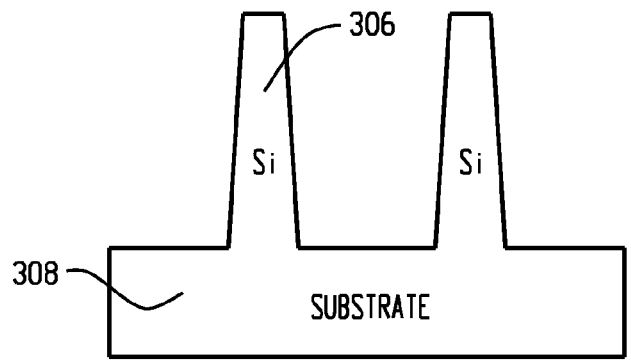
FIG. 3(A)-FIG. 3(H) depict example diagrams showing another process for forming fin structures, in accordance with some embodiments.
Figure 3B:
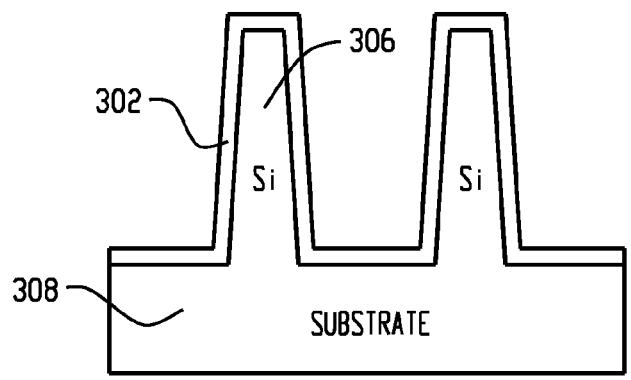

FIG. 3(A)-FIG. 3(H) depict example diagrams showing another process for forming fin structures, in accordance with some embodiments. As shown in FIG. 3(A)-FIG. 3(E), a shell material 302 is deposited to protect fin structures 304 formed through epitaxial growth. Specifically, as shown in FIG. 3(A), one or more fin structures 306 are formed on a substrate 308. For example, a patterned photoresist or hardmask is formed on the substrate 308, and the substrate 308 is etched (e.g., through a dry etching process or a wet etching process) to form the fin structures 306. As shown in FIG. 3(B), the shell material 302 is formed on the fin structures 306. For example, the shell material 302 includes silicon carbon nitride (SiCN), silicon oxygen nitride (SiON), or other suitable materials. The deposition of the shell material 302 is performed through plasma-enhanced atomic layer deposition (PEALD) with an operation pressure under $10^{-1}$ torr at a temperature in a range of about 450° C. to about 550° C.

Figure 3C:
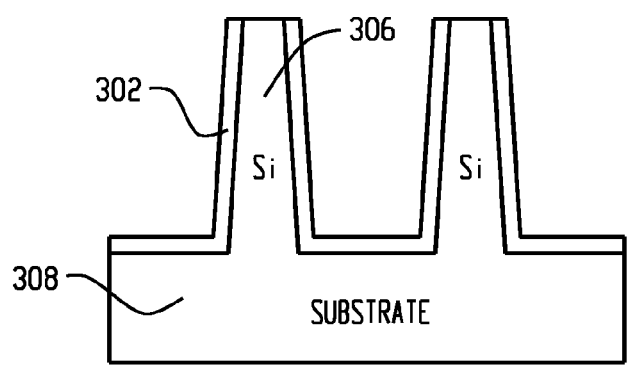
Figure 3D:
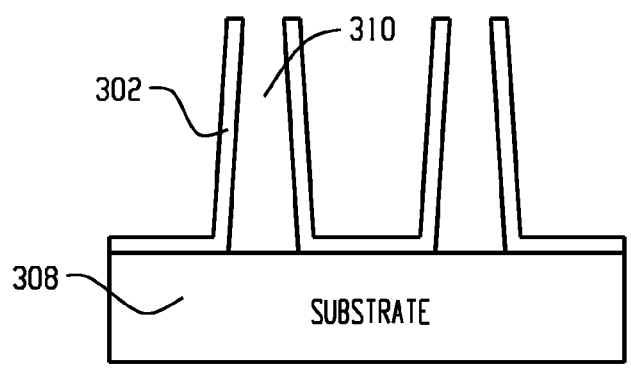
Figure 3E:
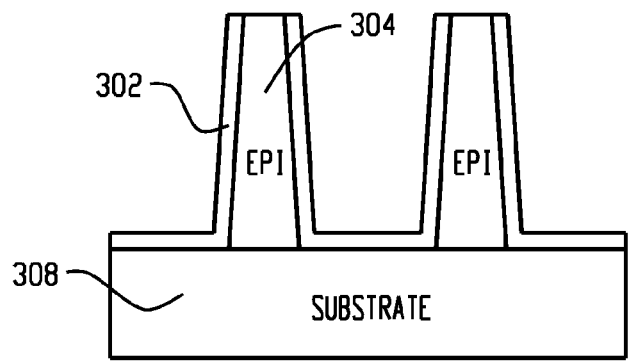
Figure 3F:
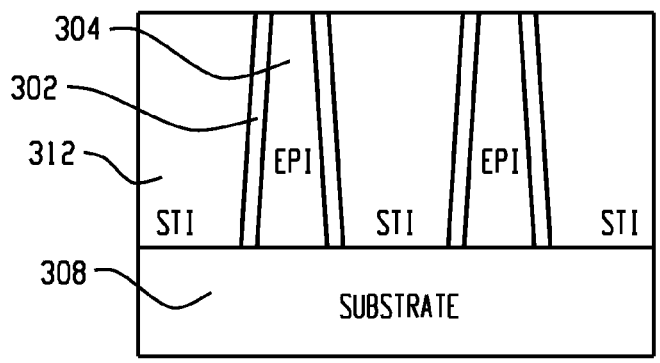

An etching process (e.g., a dry etching process or a wet etching process) is performed to remove part of the shell material 302 on a top surface of the fin structures 306, as shown in FIG. 3(C). Then, another etching process (e.g., a dry etching process or a wet etching process) is performed to remove at least part of the fin structures 306 to form one or more cavities 310. A cleaning process may be performed thereafter. A channel material (e.g., silicon, silicon germanium) is formed (e.g., through epitaxial growth) to fill the cavities 310 to form one or more second fin structures 304, as shown in FIG. 3(E). A chemical-mechanical planarization/polishing (CMP) process may be performed to remove part of the channel material that extends above the cavities 310. As shown in FIG. 3(F), a dielectric material (e.g., silicon dioxide) is deposited on the substrate 308 to form one or more STI structures 312 which surround the shell material 302 and the second fin structures 304.

Figure 3G:
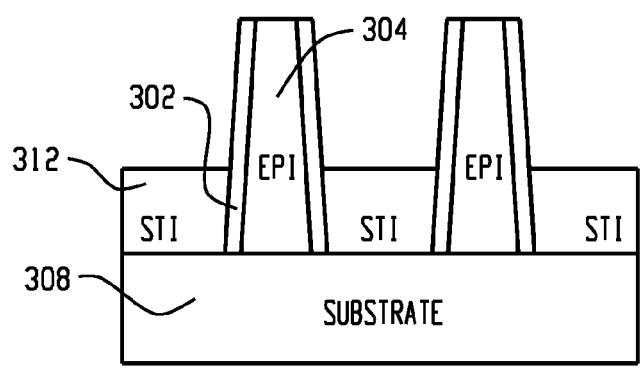
Figure 3H:
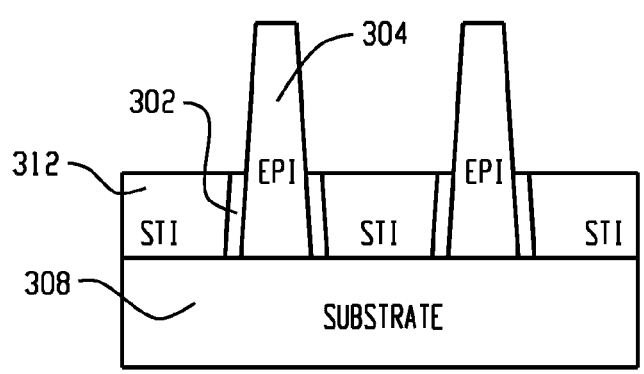

A recess process (e.g., through an etching process) is performed to remove part of the STI structures 312 to expose part of the shell material 302 that surrounds the fin structures 304, as shown in FIG. 3(G). Part of the shell material 302 is removed to expose part of the fin structures 304, as shown in FIG. 3(H). For example, the shell material 302 is removed through a wet etching process in which a solution including phosphoric acid is used at a temperature less than about 500° C. for more than 1000 seconds. The second fin structures 304 are associated with a size comparable to the desired size (e.g., the feature size of the first fin structures 306). In some embodiments, one or more additional processes may be performed to fabricate a device, such as gate structure formation and source/drain region formation.

Figures 4, 5:
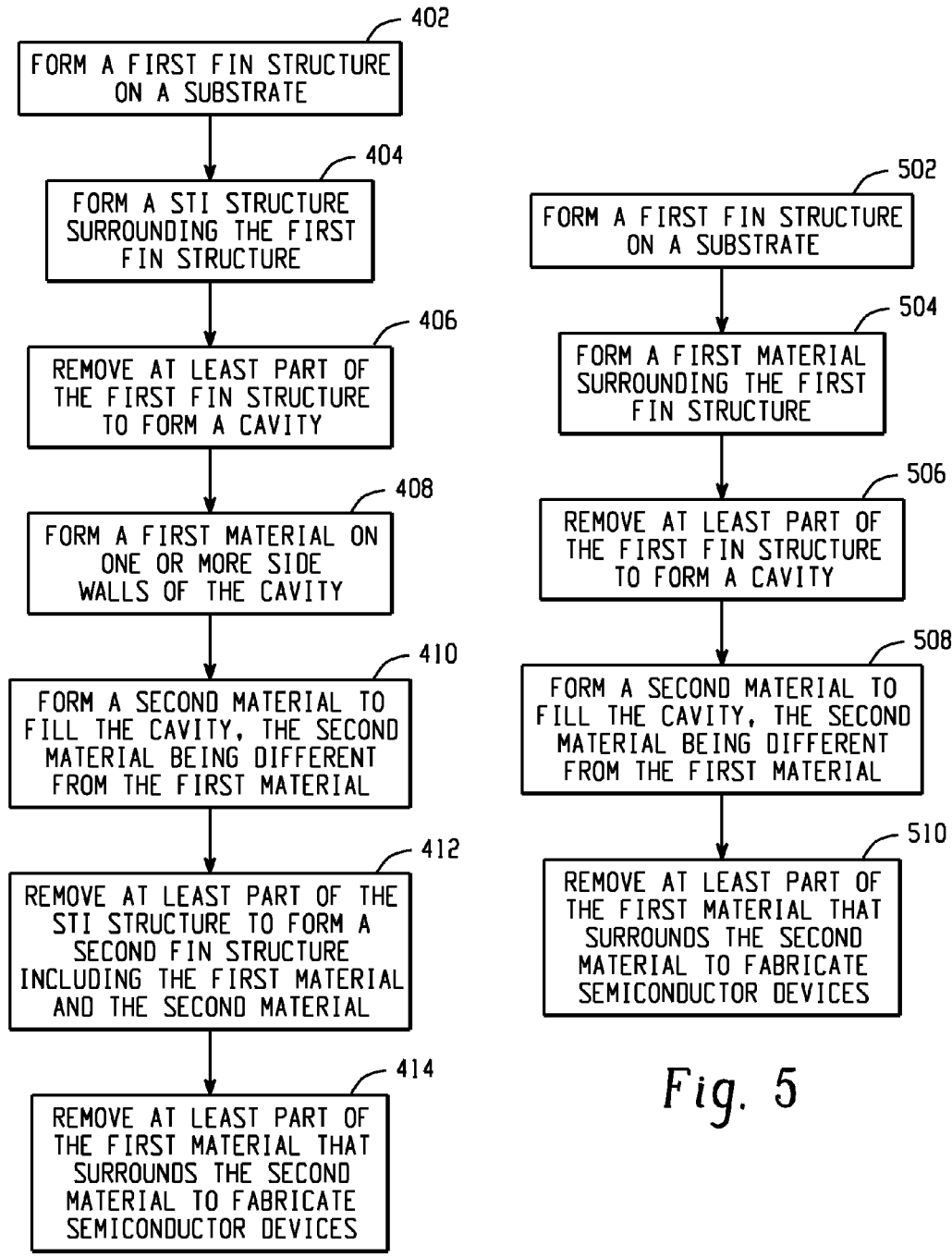
FIG. 4 depicts an example diagram showing a process for forming fin structures, in accordance with some embodiments.
FIG. 5 depicts an example diagram showing another process for forming fin structures, in accordance with some embodiments.

FIG. 4 depicts an example diagram showing a process for forming fin structures, in accordance with some embodiments. At 402, a first fin structure is formed on a substrate. At 404, a STI structure is formed surrounding the first fin structure. At 406, at least part of the first fin structure is removed to form a cavity. At 408, a first material is formed on one or more side walls of the cavity. At 410, a second material is formed to fill the cavity, the second material being different from the first material. At 412, at least part of the STI structure is removed to form a second fin structure including the first material and the second material. At 414, at least part of the first material that surrounds the second material is removed to fabricate semiconductor devices.

FIG. 5 depicts an example diagram showing another process for forming fin structures, in accordance with some embodiments. At 502, a first fin structure is formed on a substrate. At 504, a first material is formed surrounding the first fin structure. At 506, at least part of the first fin structure is removed to form a cavity. At 508, a second material is formed to fill the cavity, the second material being different from the first material. At 510, at least part of the first material that surrounds the second material is removed to fabricate semiconductor devices.

According to one embodiment, a method is provided for forming fin structures. A first fin structure is formed on a substrate. A shallow-trench-isolation structure is formed surrounding the first fin structure. At least part of the first fin structure is removed to form a cavity. A first material is formed on one or more side walls of the cavity. A second material is formed to fill the cavity, the second material being different from the first material. At least part of the STI structure is removed to form a second fin structure including the first material and the second material. At least part of the first material that surrounds the second material is removed to fabricate semiconductor devices.

According to another embodiment, a method is provided for forming fin structures. A first fin structure is formed on a substrate. A first material is formed surrounding the first fin structure. At least part of the first fin structure is removed to form a cavity. A second material is formed to fill the cavity, the second material being different from the first material. At least part of the first material that surrounds the second material is removed to fabricate semiconductor devices.

According to yet another embodiment, a device structure includes a fin structure, a shell, and a shallow-trench-isolation structure. The fin structure is formed through epitaxial growth on a substrate and includes a first material. The shell is formed to define a size of the fin structure and surrounds at least part of the fin structure. The shell includes a second material different from the first material. The shallow-trench-isolation structure surrounds the shell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first fin structure having a feature size on a substrate;
   forming a shallow trench isolation (STI) structure surrounding the first fin structure;
   removing at least part of the first fin structure to form a cavity having a size that is larger than the feature size;
   forming a first material on one or more side walls of the cavity to reduce the size of the cavity, wherein the reduced size is comparable to the feature size of the first fin structure;
   forming a second material to fill the cavity, the second material being different from the first material;
   removing at least part of the STI structure to form a second fin structure including the first material and the second material; and
   removing at least part of the first material that surrounds the second material to fabricate semiconductor devices.

2. The method of claim 1 wherein the second material is formed through epitaxial growth.

3. The method of claim 1 wherein the first material includes silicon carbon nitride (SiCN) or silicon oxygen nitride (SiON).

4. The method of claim 1 wherein at least part of the first material is removed through an etching process.

5. The method of claim 4 wherein the etching process is performed using a solution including phosphoric acid ($H_3PO_4$) for more than 1000 seconds.

6. The method of claim 1 wherein forming a first material on one or more side walls of the cavity includes:
   forming the first material on the one or more side walls of the cavity and a bottom surface of the cavity; and
   removing part of the first material on the bottom surface of the cavity.

7. The method of claim 6 wherein the first material on the bottom surface of the cavity is removed through a dry etching process.

8. The method of claim 1 wherein the first material is formed through plasma-enhanced atomic layer deposition.

9. The method of claim 1 wherein:
   the at least part of the first material that surrounds the second material is removed to expose part of the second material; and
   a gate structure is formed on the exposed second material for fabricating a transistor.

10. A method comprising:
    forming a first fin structure having a feature size on a substrate;
    forming a shallow trench isolation (STI) structure surrounding the first fin structure;
    removing at least part of the first fin structure to form a cavity having a size that is larger than the feature size;
    forming a first material on one or more side walls of the cavity and a bottom surface of the cavity to reduce the size of the cavity, wherein the reduced size is comparable to the feature size of the first fin structure;
    removing part of the first material on the bottom surface of the cavity;
    forming a second material to fill the cavity, the second material being different from the first material;
    removing at least part of the STI structure to form a second fin structure including the first material and the second material; and
    removing at least part of the first material that surrounds the second material to fabricate semiconductor devices.

11. The method of claim 10 wherein the second material is formed through epitaxial growth.

12. The method of claim 10 wherein the first material includes silicon carbon nitride (SiCN) or silicon oxygen nitride (SiON).

13. The method of claim 10 wherein at least part of the first material is removed through an etching process.

14. The method of claim 13 wherein the etching process is performed using a solution including phosphoric acid ($H_3PO_4$) for more than 1000 seconds.

15. The method of claim 10 wherein the first material on the bottom surface of the cavity is removed through a dry etching process.

16. The method of claim 10 wherein the first material is formed through plasma-enhanced atomic layer deposition.

17. The method of claim 10 wherein:
    the at least part of the first material that surrounds the second material is removed to expose part of the second material; and
    a gate structure is formed on the exposed second material for fabricating a transistor.

18. A method comprising:
    forming a first fin structure having a feature size on a substrate;
    forming a shallow trench isolation (STI) structure surrounding the first fin structure;
    removing at least part of the first fin structure to form a cavity having a size that is larger than the feature size;
    forming a first material on one or more side walls of the cavity and a bottom surface of the cavity to reduce the size of the cavity, wherein the reduced size is comparable to the feature size of the first fin structure;
    removing part of the first material on the bottom surface of the cavity to expose the substrate;

forming a second material over the substrate to fill the cavity, the second material being different from the first material;

removing at least part of the STI structure to form a second fin structure including the first material and the second material; and removing at least part of the first material that surrounds the second material to fabricate semiconductor devices.

19. The method of claim 18 wherein the second material is formed through epitaxial growth.

20. The method of claim 1, wherein the forming of the cavity comprises:

removing an entirety of the first fin structure; and removing a portion of the STI structure.

21. The method of claim 1, wherein the second fin structure includes at least first and second sidewalls, and wherein the removing of the at least part of the STI structure to form the second fin structure exposes at least portions of the first and second sidewalls of the second fin structure.

22. The method of claim 10, wherein the forming of the cavity comprises:

removing an entirety of the first fin structure; and removing a portion of the STI structure.

23. The method of claim 10, wherein the second fin structure includes at least first and second sidewalls, and wherein the removing of the at least part of the STI structure to form the second fin structure exposes at least portions of the first and second sidewalls of the second fin structure.

24. The method of claim 18, wherein the forming of the cavity comprises:

removing an entirety of the first fin structure; and removing a portion of the STI structure.

25. The method of claim 18, wherein the second fin structure includes at least first and second sidewalls, and wherein the removing of the at least part of the STI structure to form the second fin structure exposes at least portions of the first and second sidewalls of the second fin structure.

* * * * *